United States Patent
Sugimura

(10) Patent No.: US 7,157,369 B2
(45) Date of Patent: Jan. 2, 2007

(54) SEMICONDUCTOR DEVICE AND METHOD OF MANUFACTURING THEREOF

(75) Inventor: Hirotoshi Sugimura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/877,995

(22) Filed: Jun. 29, 2004

(65) Prior Publication Data

US 2005/0001253 A1    Jan. 6, 2005

(30) Foreign Application Priority Data

Jul. 4, 2003    (JP)    ............... 2003-271016

(51) Int. Cl.
*H01L 21/4763*    (2006.01)
*H01L 21/44*    (2006.01)

(52) U.S. Cl. ............. 438/629; 438/637; 438/639; 438/640; 438/667; 438/622; 438/618; 438/666

(58) Field of Classification Search ............... 438/629, 438/637, 639, 640, 667, 118, 622, 618, 666
See application file for complete search history.

(56) References Cited

U.S. PATENT DOCUMENTS 5,792,691 A * 8/1998 Koga ............... 438/253
6,046,477 A * 4/2000 Noble ............. 257/347

FOREIGN PATENT DOCUMENTS

JP    2003-7854    1/2003

\* cited by examiner

*Primary Examiner*—Douglas W. Owens
*Assistant Examiner*—Samuel Gebremariam
(74) *Attorney, Agent, or Firm*—Young & Thompson

(57) ABSTRACT

There is provided a method of manufacturing a semiconductor device that can reduce the number of processes, and decrease contact resistance between plugs. The method comprises forming a first interlayer dielectric film having a first opening where a contact plug is to be formed; uniformly forming a first conductive layer on the first interlayer dielectric film and in the first opening; forming a resist defining an interconnect pattern by a lithography process on a region excluding the first opening; performing first anisotropic etching to remove a region of the first conductive layer not covered with the resist until an upper face of the first interlayer dielectric film is exposed, thus to form an interconnect and the contact plug.

17 Claims, 9 Drawing Sheets

PRIOR ART

PRIOR ART

SEMICONDUCTOR DEVICE AND METHOD OF MANUFACTURING THEREOF

This application is based on Japanese patent application No.2003-271016, the content of which is incorporated hereinto by reference.

BACKGROUND OF THE INVENTION

1. Field of the Invention

The present invention relates to a semiconductor device and a method of manufacturing thereof.

2. Description of the Related Art

A constitution of a DRAM memory cell to be used in a semiconductor device, particularly a DRAM (Dynamic Random Access Memory) or a logic-embedded DRAM etc., as well as a method of manufacturing such memory cell have been disclosed in Japanese Patent laid open No.2003-007854.

FIG. 8 is a schematic cross-sectional view showing a memory cell region formed in a conventional DRAM. Here, since transistors are similar to those disclosed in the cited document, detailed description thereof will be omitted.

A DRAM memory cell is provided with a transistor formed on a semiconductor substrate 100 and a capacitance formed on the transistor via an interlayer dielectric film. As shown in FIG. 8, contact plugs are employed to electrically connect a source electrode 112 of the transistor and the capacitance. The contact plugs include a cell contact plug formed between the transistor and a bit line, which is an interconnect for applying a voltage to a drain electrode 114 of the transistor, and a capacitance contact plug 270 for connecting the cell contact plug and the capacitance.

The cell contact plug is classified into a first cell contact plug 250 for connecting the drain electrode 114 of the transistor and the bit line, and a second cell contact plug 252 connected to the capacitance contact plug 270.

The source electrode 112 and the drain electrode 114 of the transistor are constituted of an impurity diffusion layer formed by diffusing an impurity on a surface of the semiconductor substrate, and a lateral face of the source electrode 112 and the drain electrode 114 in the semiconductor substrate is covered with an isolation dielectric layer 116 except in an active region, which is not shown.

The capacitance is provided with a lower electrode 180 for accumulating charge therein, an upper electrode 184 to serve as a plate electrode, and a dielectric 182 disposed between the lower electrode 180 and the upper electrode 184. The lower electrode 180 is connected to the capacitance contact plug 270.

Also, the first cell contact plug 250 and the second cell contact plug 252 are electrically insulated by a silicon oxide layer 104. Likewise, a first bit line 260, a second bit line 262, a third bit line 264 and the capacitance contact plug 270 are electrically insulated from one another, by a silicon oxide layer 105 and a silicon oxide layer 106.

A method of manufacturing such a semiconductor device will be described below.

As shown in FIG. 9A, the isolation dielectric layer 116 is first formed on the semiconductor substrate 100, and the transistor provided with the source electrode 112 and the drain electrode 114 etc. is formed, after which a silicon nitride layer 102 and a silicon oxide layer 104 are formed. Then a cell contact hole 230 for later forming a cell contact plug therein is formed in the silicon nitride layer 102 and the silicon oxide layer 104, by a known lithography and etching process, and a titanium nitride (TiN) layer 254 and a tungsten (W) layer 256, are filled in the cell contact hole 230 to act as conductive layers, and also formed on the silicon oxide layer 104. Thereafter CMP (Chemical Mechanical Polishing) is performed to remove the conductive layers on the silicon oxide layer 104, so that the first cell contact plug 250 and the second cell contact plug 252 are formed.

Then, plasma CVD (Chemical Vapor Deposition) is carried out to form the silicon oxide layer 105, to ensure insulation between the second cell contact plug 252 and the bit line, and a bit contact hole 232 is formed in the silicon oxide layer 105 at a position corresponding to the first cell contact plug 250, by a known lithography and etching process. And a TiN layer 266 and a W layer 268 are successively formed to constitute conductive layers (FIG. 9B).

Thereafter, in order to form the bit line from the conductive layers, a resist 290 is formed by a known lithography process, and anisotropic etching is performed on the TiN layer 266 and the W layer 268 to form the first bit line 260, the second bit line 262 and the third bit line 264 (FIG. 9C).

After removing the resist 290, the silicon oxide layer 106 shown in FIG. 8 is formed. Then the capacitance contact plug 270 shown in FIG. 8 is formed in the silicon oxide layer 106 by a method similar to forming the cell contact plug. Then, an SiON layer 108 and a silicon oxide layer 110 are formed, and a capacitance opening is formed in the SiON layer 108 and the silicon oxide layer 110 at a position corresponding to the capacitance contact plug 270, by a known lithography and etching process. Now after forming a TiN layer that serves as the lower electrode 180 on a bottom portion and a side wall of the capacitance opening, an insulation layer to serve as a dielectric is formed and further an impurity-diffused polysilicon layer is buried in the capacitance opening. Then, the dielectric 182 and the upper electrode 184 are formed by a known lithography and etching process. Finally the semiconductor device is completed upon forming an interlayer dielectric film and providing an interconnect among the elements and a protection layer, which are not shown.

According to the foregoing method of manufacturing, the silicon oxide layer 105 is provided as the interlayer dielectric film, to better ensure insulation between the bit line and the second cell contact plug, and the bit contact hole is formed to connect the first cell contact plug and the first bit line. This requires a lithography process and an etching process to form the bit contact hole in the silicon oxide layer 105, which results in a drawback that a manufacturing period of the semiconductor device is prolonged because of an increase in the number of process.

Besides, in case where the capacitance contact plug is formed in a downwardly tapered shape as shown in FIG. 8, an area of a cross-section orthogonal to a direction toward the second cell contact plug from inside the capacitance contact plug, becomes smaller at a position closer to the second cell contact plug. Accordingly, the greater a distance between the second cell contact plug and the lower electrode of the capacitance is, the smaller a contact area of the second cell contact plug and the capacitance contact plug becomes. Consequently, in case where the silicon oxide layer 105 is provided as the interlayer dielectric film as described above, since a distance between the second cell contact plug and the lower electrode inevitably becomes as much greater, a contact area between the plugs becomes smaller, resulting in an increase of resistance.

SUMMARY OF THE INVENTION

The present invention has been conceived to solve the foregoing problems incidental to the conventional art, with an object to efficiently and stably provide a semiconductor device that has a minimized contact resistance between a conductive plug and another conductive component.

According to the present invention, there is provided a method of manufacturing a semiconductor device including a transistor formed on a semiconductor substrate and a capacitance element formed on the transistor and connected thereto, comprising forming a transistor on a semiconductor substrate; forming a first interlayer dielectric film that covers the transistor; forming a first connection hole and a second connection hole in the first interlayer dielectric film so as to reach an upper face of the transistor; forming a continuous conductive layer in the first connection hole, in the second connection hole and on the first interlayer dielectric film, to thereby form a first conductive plug in the first connection hole, a second conductive plug in the second connection hole, and a surface conductive layer on the first interlayer dielectric film; forming a resist layer in a region on the surface conductive layer including right above the first conductive plug but excluding right above the second conductive plug; performing anisotropic etching on the surface conductive layer utilizing the resist layer as a mask to form a bit line connected to the first conductive plug and to expose an upper face of the second conductive plug; forming a second interlayer dielectric film on the first interlayer dielectric film; forming a third conductive plug connected to the second conductive plug in the second interlayer dielectric film; and forming a capacitance element connected to the third conductive plug on the second interlayer dielectric film.

According to such method, the continuous conductive layer, from which the first conductive plug and the second conductive plug are formed, is also utilized to constitute the surface conductive layer to be subsequently formed into the bit line. Such arrangement eliminates need of forming an additional conductive layer for the bit line, thereby shortening the manufacturing process.

Also, in the method of manufacturing a semiconductor device according to the present invention, the step of forming the bit line and exposing an upper face of the second conductive plug may include forming a recess on an upper face of the second conductive plug.

According to such method, since an upper face of the second conductive plug is recessed, a contact area of the third conductive plug with the second conductive plug becomes greater than in a conventional device, thereby reducing a contact resistance.

Also, the method of manufacturing a semiconductor device according to the present invention may further comprise performing anisotropic etching on an upper face of the second conductive plug so as to locate the upper face of the second conductive plug lower than an upper face of the first interlayer dielectric film.

According to such method, because of the second anisotropic etching process, a distance between the second conductive plug and the bit line provided on the first interlayer dielectric film becomes greater. As a result, insulation between the second conductive plug and the bit line can be better ensured.

According to the present invention, there is provided a semiconductor device including a transistor formed on a semiconductor substrate and a capacitance element formed on the transistor and connected thereto, comprising a semiconductor substrate; a transistor formed on the semiconductor substrate; a first interlayer dielectric film formed on the semiconductor substrate so as to cover the transistor; a first conductive plug formed in the first interlayer dielectric film and connected to the transistor; a second conductive plug having a recess on an upper face thereof, formed in the first interlayer dielectric film and connected to the transistor; a bit line formed on the first interlayer dielectric film and connected to the first conductive plug; a second interlayer dielectric film formed on the first interlayer dielectric film so as to cover the bit line; a third conductive plug formed in the second interlayer dielectric film, connected to a region including the recess on the upper face of the second conductive plug; and a capacitance element formed in the second interlayer dielectric film and connected to the third conductive plug.

According to such constitution, since an upper face of the second conductive plug is recessed, a contact area of the third conductive plug with the second conductive plug becomes larger than in a conventional device, thereby reducing a contact resistance.

Referring to the foregoing description on the present invention, it is to be understood that various optional combinations of the above constitution are also effectively included in the present invention. Also, application of a constitution in the present invention to another category is also effectively included in the present invention.

With the foregoing constitution, the present invention provides the following benefits.

According to the present invention, the first conductive plug, the second conductive plug, and the surface conductive layer to be subsequently formed into the bit line are all formed from the continuous conductive layer. Such constitution eliminates need of forming an additional conductive layer for the bit line, thereby shortening the manufacturing process.

Also, since an upper face of the second conductive plug is recessed, a contact area of the third conductive plug with the second conductive plug becomes larger than in a conventional device, thereby reducing a contact resistance.

DESCRIPTION OF THE PREFERRED EMBODIMENT

Figure 1:
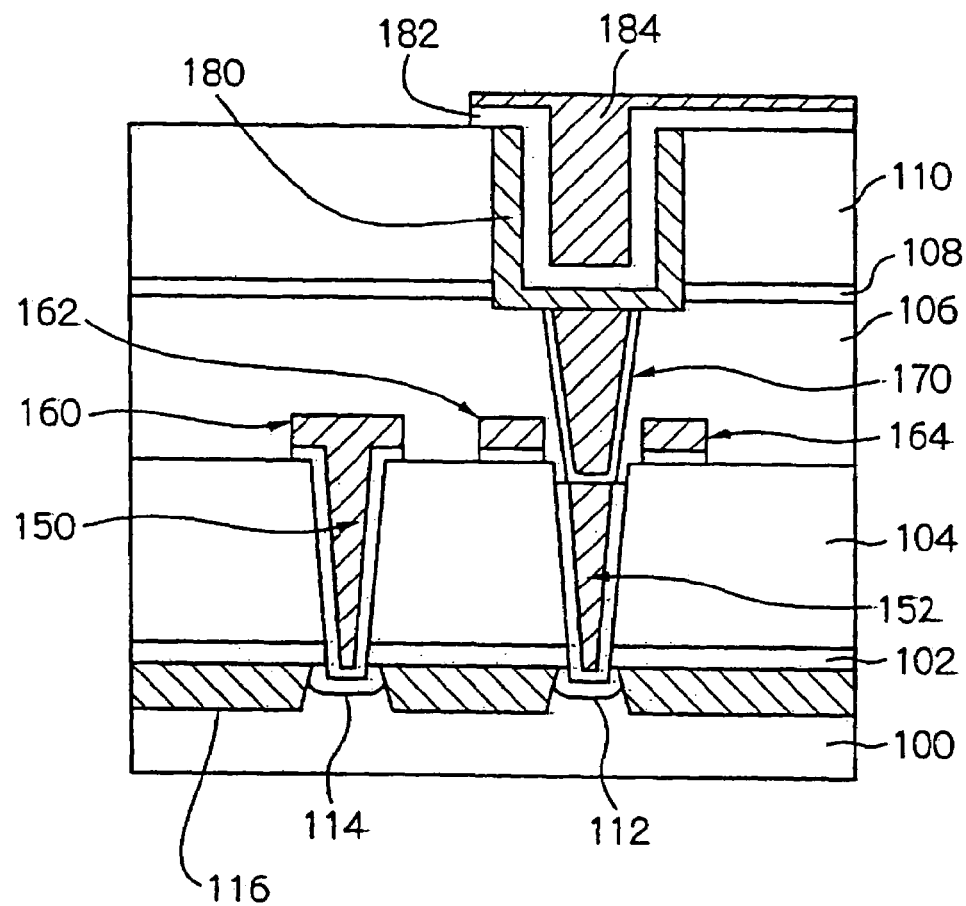
FIG. 1 is a schematic cross-sectional view showing a constitution of a semiconductor device according to a first working example.

Hereunder, an embodiment of the present invention will be described in details.

A semiconductor device according to the embodiment has an advantageous feature that a cell contact plug and a bit line are both formed from a conductive layer provided for filling in a cell contact hole.

Also, a method of manufacturing a semiconductor device according to the embodiment is for manufacturing a semiconductor device including a contact plug and an interconnect electrically insulated from the contact plug, and comprises forming a first interlayer dielectric film having a first opening where a contact plug is to be formed; uniformly forming a first conductive layer on the first interlayer dielectric film and in the first opening; forming a resist defining an interconnect pattern by a lithography process on a region excluding the first opening; performing first anisotropic etching to remove a region of the first conductive layer not covered with the resist until an upper face of the first interlayer dielectric film is exposed, thus to form an interconnect and the contact plug.

According to the embodiment, the interconnect, which is electrically insulated from the contact plug, is also formed from the first conductive layer for forming the contact plug. Such constitution eliminates need of forming an additional conductive layer for the bit line, thereby shortening the manufacturing process.

Also, in the method of manufacturing a semiconductor device according to the embodiment, the step of forming the first conductive layer may further comprise forming a recess on an upper face of the first conductive layer at a position corresponding to the first opening; performing a first anisotropic etching to form a recess on an upper face of the contact plug; forming the interconnect and the contact plug and then removing the resist; forming a second interlayer dielectric film having a second opening through which to expose a part of the recess of the contact plug; and forming a second conductive layer in the second opening.

According to the embodiment, since an upper face of the first conductive layer is recessed at a position corresponding to the first opening, an upper face of the contact plug also becomes recessed after the first anisotropic etching. Therefore, a contact area of the contact plug with the second conductive layer becomes larger than in a conventional device, thereby reducing a contact resistance.

Also, in the method of manufacturing a semiconductor device according to the embodiment, a maximum diameter of the first opening may be made 1.3 to 2 times as large as a film thickness of the first conductive layer.

According to the embodiment, since a maximum diameter of the first opening may be made 1.3 to 2 times as large as a film thickness of the first conductive layer, the conductive layer can be buried to a sufficient depth in their first opening. Therefore, the conductive layer can be prevented from being totally removed from the first opening by the first anisotropic etching.

Also, in the method of manufacturing a semiconductor device according to the embodiment, the step of performing the first anisotropic etching may further comprise performing a second anisotropic etching for scraping the first conductive layer of the contact plug, for extending a minimum distance between the contact plug and the interconnect.

According to the embodiment, the second anisotropic etching extends a distance between the contact plug and the interconnect, thereby enhancing insulation between the contact plug and the interconnect.

Also, in the method of manufacturing a semiconductor device according to the embodiment, the first conductive layer may be formed by CVD method.

According to the embodiment, since the first conductive layer is formed by CVD method, a recess is formed on a region of an upper face of the first conductive layer corresponding to the first opening. Also, a surface of the first conductive layer becomes uneven because of crystal grains. Therefore, a contact area between the contact plug and the second conductive layer is further enlarged, and resultantly a contact resistance is further minimized.

Further, in the method of manufacturing a semiconductor device according to the embodiment, the first conductive layer may contain tungsten.

Now, for achieving the foregoing object, the semiconductor device according to the embodiment comprises a first contact plug and a second contact plug connected to the first contact plug, and the first contact plug has a recess in a region to be in contact with the second contact plug. Also, the second contact plug is of such a shape that a cross-section thereof, orthogonal to a direction toward the first contact plug from inside the second contact plug, becomes smaller at a position closer to the first contact plug.

According to the embodiment, the first contact plug has a recess in a region to be in contact with the second contact plug. Therefore, despite that a cross-section of the second contact plug orthogonal to a direction toward the first contact plug becomes smaller at a position closer to the first contact plug, a contact area between the first contact plug and the second contact plug becomes larger than in a conventional device, thereby reducing a contact resistance.

Now the present invention will be described in further details hereunder according to working examples, however it is to be understood that the present invention is not limited to these working examples.

First Working Example

A constitution of a semiconductor device according to this working example will be described. The constitution described herein is based on a DRAM as in a conventional device.

FIG. 1 is a schematic cross-sectional view showing a constitution of a semiconductor device according to a first working example, which is a cross-sectional view of a memory cell region in a DRAM. In the subsequent passages, components referred to in the foregoing description are given an identical numeral, and detailed description thereof will be omitted.

As shown in FIG. 1, the semiconductor device is provided with a second cell contact plug 152 connected to a source electrode 112 of a transistor, and a capacitance contact plug 170 connected to the second cell contact plug 152.

In this working example, the silicon oxide layer 105 is not provided as an interlayer dielectric film unlike a conventional device. Accordingly, a distance between the second cell contact plug 152 and the lower electrode 180 becomes shorter, and a contact area between the second cell contact plug 152 and a capacitance contact plug 170 therefore becomes larger than in a conventional device, in case where the capacitance contact plug 170 is of a downwardly tapered shape. Consequently, contact resistance between the plugs is reduced. Here, forming the capacitance contact plug 170 in a downwardly tapered shape permits securing room for absorbing a positioning error of a second bit line 162 and a third bit line 164 with respect to the capacitance contact plug 170.

Also, a first bit line 160 is formed as a unified part of a first cell contact plug 150. Therefore, when a voltage is applied to the first bit line 160, a voltage drop due to contact resistance, conventionally observed between a bit line and a cell contact plug, is minimized so that a voltage closer to the voltage at the first bit line 160 is applied to the drain electrode 114 of the transistor.

Further, an uppermost portion of the second cell contact plug 152 is located at a lower level than a lower face of the second bit line 162 and the third bit line 164. Therefore insulation between the second contact plug 152 and the two bit lines can be better ensured.

Also, the first cell contact plug 150 and the second cell contact plug 152 are located in the silicon oxide layer 104, and are therefore electrically insulated from each other by the silicon oxide layer 104. Further, the first bit line 160, the second bit line 162, the third bit line 164, and the capacitance contact plug 170 are formed in the silicon oxide layer 106, and are therefore electrically insulated from one another by the silicon oxide layer 106.

Now, a method of manufacturing the foregoing semiconductor device will be described.

The method of manufacturing the semiconductor device according to the first working example comprises forming a conductive layer on an interlayer dielectric film and burying the conductive layer in an opening provided in the interlayer dielectric film, and then forming the bit lines and the cell contact plugs by a lithography and etching process.

FIGS. 2A through 5 are schematic cross-sectional views showing method of manufacturing the semiconductor device according to this working example.

Figure 2A:
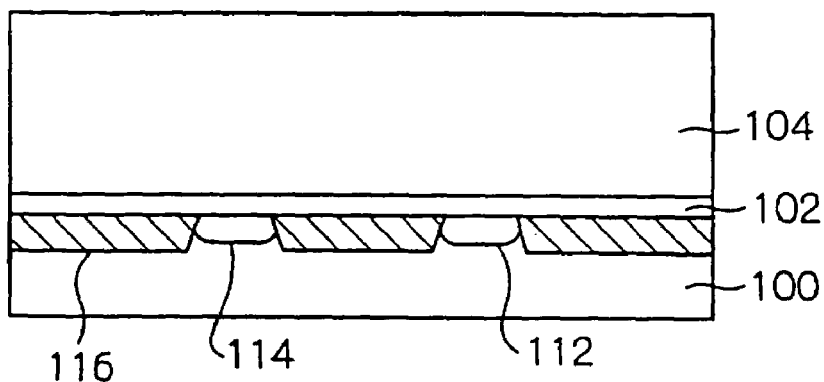
FIGS. 2A to 2C are schematic cross-sectional views showing a method of manufacturing the semiconductor device according to the first working example.

As shown in FIG. 2A, the isolation dielectric layer 116 is formed on the semiconductor substrate 100, and a transistor provided with the source electrode 112 and the drain electrode 114 is formed by a conventionally known method. Thereafter, a silicon nitride layer 102 is formed in a thickness of 30 to 60 nm for use as an etch stopper, and the silicon oxide layer 104 is formed by plasma CVD in a thickness of 250 to 400 nm, which serves as an interlayer dielectric film.

Figure 2B:
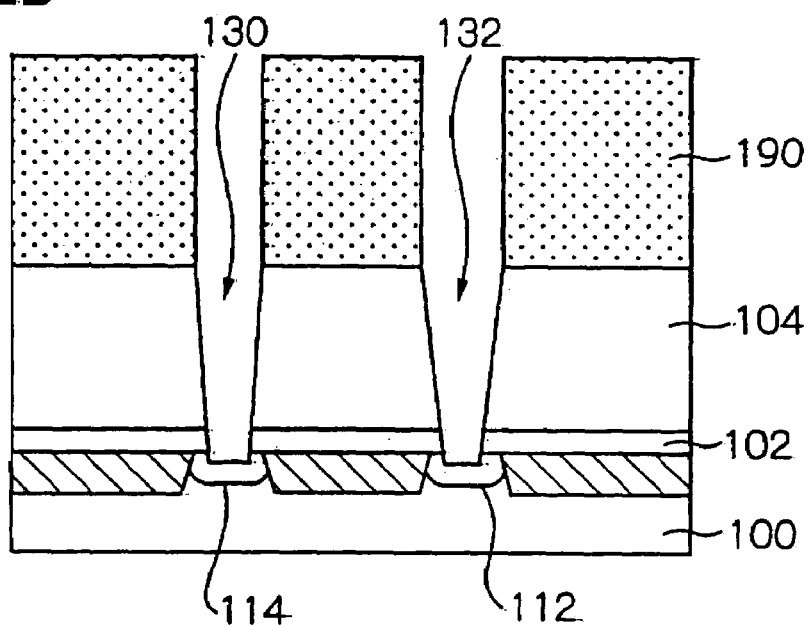

Then a resist 190 for defining a predetermined opening pattern is formed by a known lithography process, after which anisotropic etching is performed to form a first cell contact hole 130 reaching the drain electrode 114, and a second cell contact hole 132 reaching the source electrode 112, in the silicon nitride layer 102 and the silicon oxide layer 104 (FIG. 2B). In the subsequent passages, the first cell contact hole 130 and the second cell contact hole 132 will be collectively referred to as cell contact holes, and the cell contact holes correspond to the first opening according to the present invention.

Figure 2C:
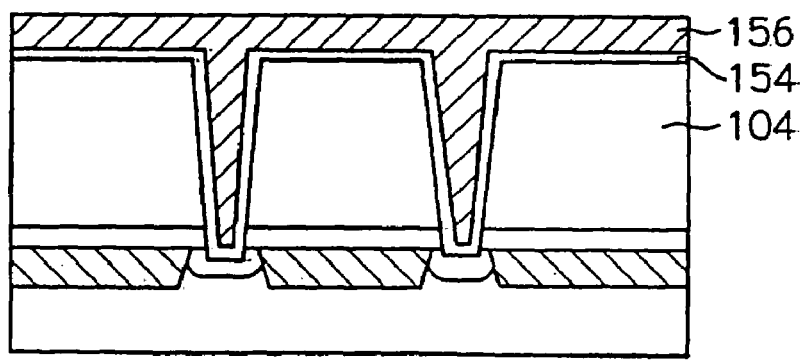

After removing the resist 190, a TiN layer 154 that serves as a barrier metal layer is formed, and a W layer 156 is uniformly formed by CVD method so that tungsten is buried in the cell contact holes (FIG. 2C). At this stage, a surface of the W layer 156 becomes uneven because of crystal grains, as a result of performing the CVD method to form the W layer 156.

Figure 3D:
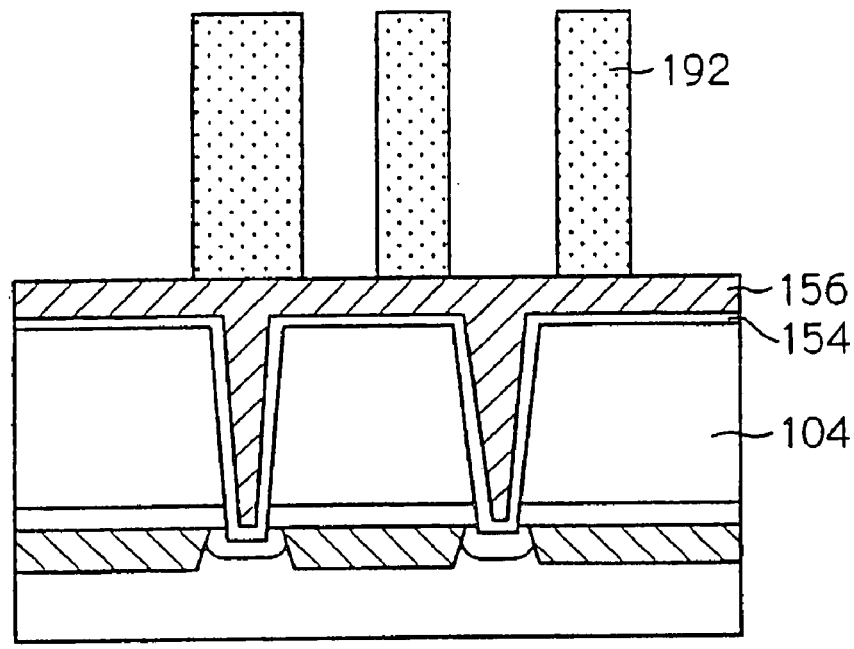
FIGS. 3D and 3E are schematic cross-sectional views showing a method of manufacturing the semiconductor device according to the first working example.

Then a resist 192 for defining a bit line pattern is formed by a known lithography process (FIG. 3D). In order to remove a portion of the W layer 156 where an upper face thereof is exposed, anisotropic etching is performed utilizing a mixed etching gas including $SF_6$ and $CHF_3$ etc.

Figure 3E:
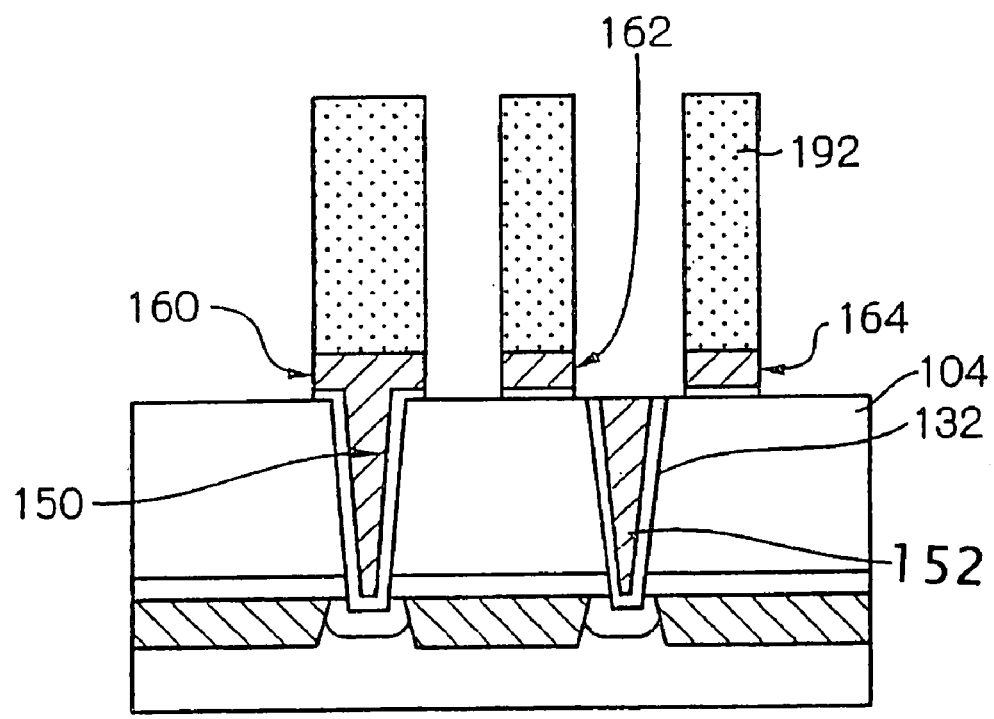

Thereafter, anisotropic etching is performed utilizing a mixed etching gas including $Cl_2$ and Ar etc. in order to remove a portion of the TiN layer 154 where an upper face thereof has been exposed as a result of removing the W layer 156, so that the first bit line 160, the second bit line 162 and the third bit line 164 are formed (FIG. 3E). As shown in FIG. 3E, at this stage the first bit line 160 and the first cell contact plug 150 are formed into a unified constituent.

Also, an upper face of the W layer 156 in the second cell contact hole 132 has an uneven surface. This is because, since the anisotropic etching for forming the bit line is uniformly performed on the W layer 156, the uneven surface shape formed through the process of FIG. 2C reappears on an upper face of the W layer 156 after the etching process.

Figure 4F:
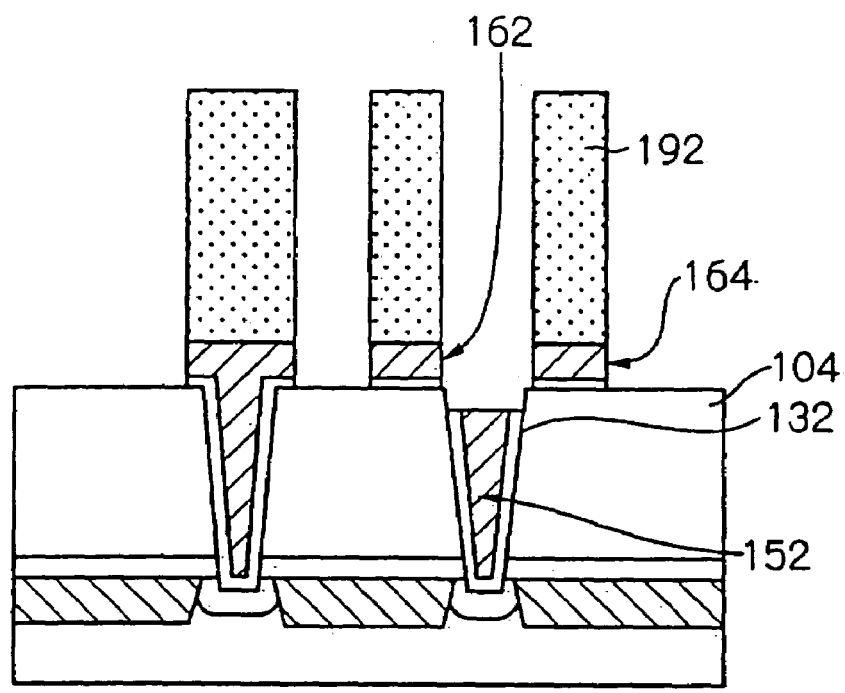
FIGS. 4F and 4G are schematic cross-sectional views showing a method of manufacturing the semiconductor device according to the first working example.

Then an additional etching process is performed under the same etching condition as that for the TiN layer 154, to scrape the W layer 156 and the TiN layer 154 in the second cell contact hole 132 as shown in FIG. 4F, so that an uppermost portion of the second cell contact plug 152 is located at a lower level than a lower face of the second bit line 162 and the third bit line 164. At this stage, since the etching condition for the TiN layer has a sufficiently great etching selectivity with respect to a silicon oxide layer, the silicon oxide layer is scarcely etched.

Figure 4G:
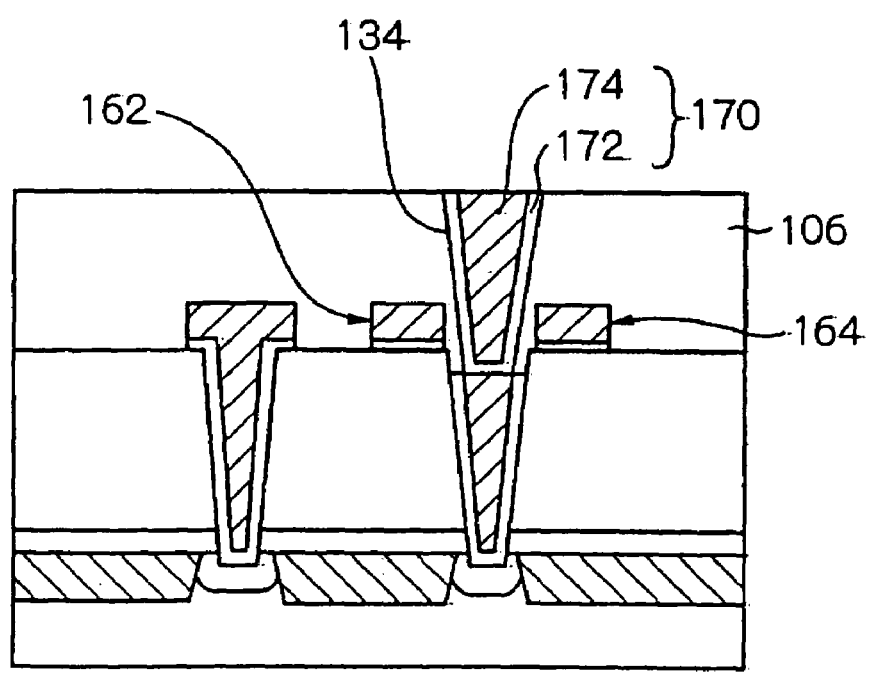

After removing the resist 192, the silicon oxide layer 106, which serves as an interlayer dielectric film, is formed in a thickness of 250 to 400 nm. Then a capacitance contact hole 134, which corresponds to the second opening, is formed by a known lithography and etching process. After that a TiN layer 172 that serve as a barrier metal layer and a W layer 174 are formed, and CMP process is performed to scrape the W layer 174 and the TiN layer 172 until an upper face of the silicon oxide layer 106 is exposed, to thereby form the capacitance contact plug 170 (FIG. 4G).

Figure 5:
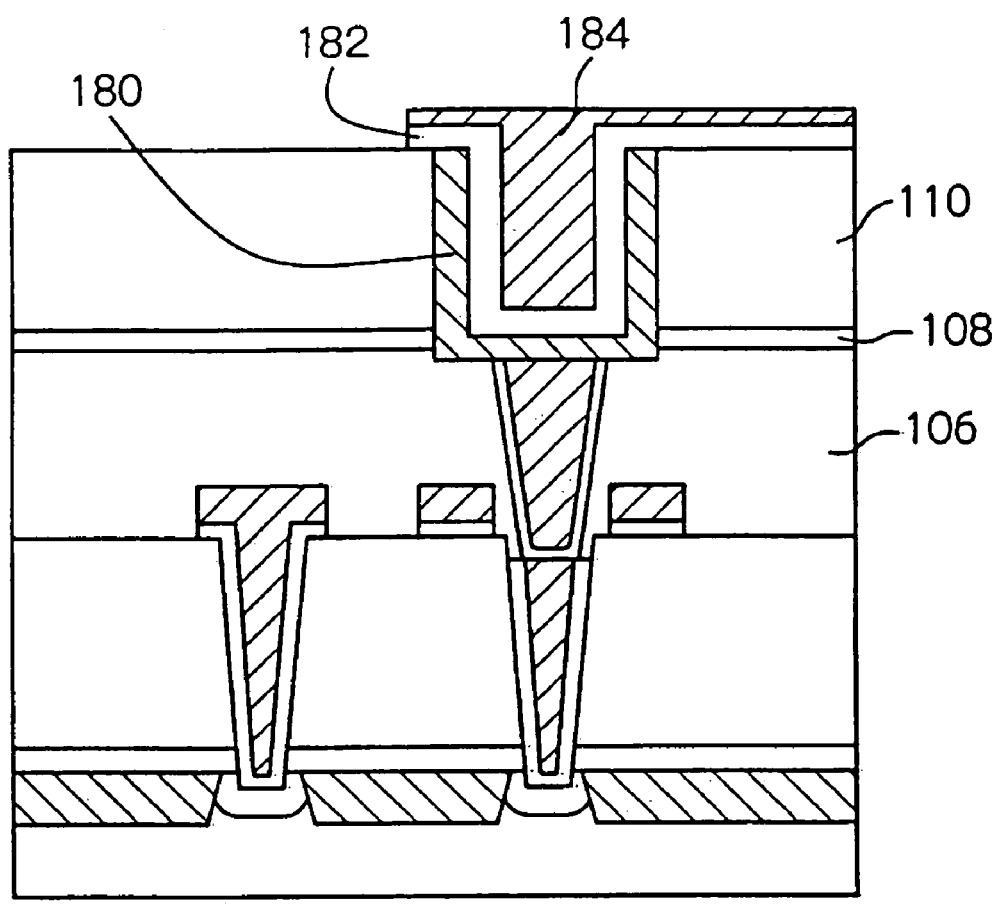
FIG. 5 is a schematic cross-sectional view showing a method of manufacturing the semiconductor device according to the first working example.

Thereafter, the SiON layer 108 is formed in a thickness of 30 to 60 nm as an etch stopper, and the silicon oxide layer 110 in a thickness of 250 to 400 nm as an interlayer dielectric film. Finally a capacitance opening is formed in the SiON layer 108 and the silicon oxide layer 110 by a conventionally known method, and the lower electrode 180, the dielectric 182 and the upper electrode 184 of the capacitance are formed in the capacitance opening (FIG. 5). As from this stage, since the process is similar to a conventional one, description thereof will be omitted.

According to this working example, the conductive layer for forming the cell contact plugs is also used for forming the bit lines. Such arrangement eliminates need of performing the CMP process for forming the cell contact plugs, as well as need of forming an additional conductive layer for forming the bit lines.

Also, in a conventional device the silicon oxide layer 105 is provided to ensure insulation between the second cell contact plug 252 and the second bit line 262/third bit line 264. By contrast, according to the working example the conductive layers in the second cell contact plug 152 are scraped by anisotropic etching, so as to prolong a minimum distance between the second cell contact plug 152 and the second bit line 162/third bit line 164. Therefore insulation between the second cell contact plug 152 and the bit lines is better ensured. Consequently, it is no longer necessary to form the silicon oxide layer 105.

Further, in case where the silicon oxide layer 105 is provided, the bit contact hole 232 has to be formed in order to connect the first bit line 260 and the first cell contact plug 250. However according to this working example, it is no longer necessary to perform the lithography and etching process to form the bit contact hole 232.

In summary, the method according to this working example can save a CMP process for the cell contact plug, formation of an additional conductive layer for the bit lines, formation of the silicon oxide layer 105, and a lithography and etching process for forming the bit contact hole 232. This permits simplification of the manufacturing process, thereby shortening a manufacturing period of the semiconductor device.

Also, since an upper surface of the second cell contact plug 152 has an uneven shape because of crystal grains, a contact area with the capacitance contact plug 170 becomes larger and resultantly contact resistance is reduced.

Second Working Example

An advantageous feature of this working example is that an area of the cell contact plug that makes contact with the capacitance contact plug is recessed.

A constitution of a semiconductor device according to this working example is described hereunder.

Figure 6:
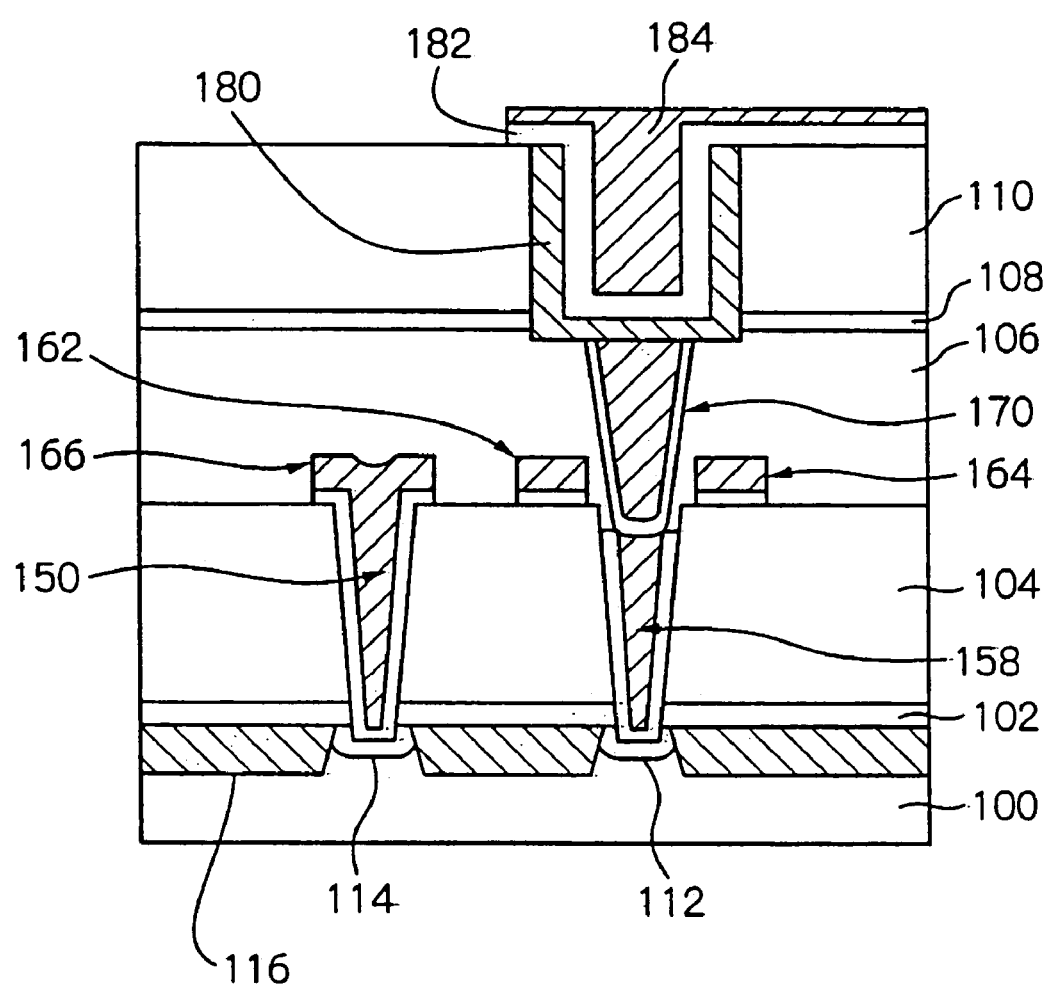
FIG. 6 is a schematic cross-sectional view showing a constitution of a semiconductor device according to a second working example.

FIG. 6 is a schematic cross-sectional view showing a constitution of a semiconductor device according to this working example. In the subsequent passages, components referred to in the first working example are given an identical numeral, and detailed description thereof will be omitted.

As shown in FIG. 6, a central region of a contact area of the second cell contact plug 158 with the capacitance contact plug 170 is recessed. Therefore, a contact area of the second cell contact plug 158 with the capacitance contact plug 170 becomes larger, and resultantly contact resistance is reduced.

Now a method of manufacturing of the semiconductor device according to this working example will be described. Here, detailed description of the same process as the first working example will be omitted.

Firstly the silicon nitride layer 102 and the silicon oxide layer 104 are formed by the process shown in FIGS. 2A and 2B of the first working example. Then the first cell contact hole 130 and the second cell contact hole 132 are formed. In this working example, the first cell contact hole 130 and the second cell contact hole 132 are formed so that an upper face diameter thereof becomes 0.12 to 0.14 µm.

Figure 7A:
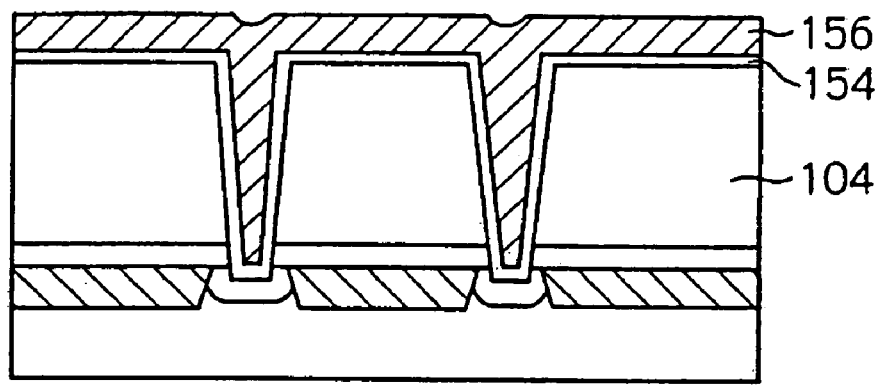
FIGS. 7A and 7B are schematic cross-sectional views showing a method of manufacturing the semiconductor device according to the second working example.

Then after removing the resist 190, the TiN layer 154 that serves as a barrier metal layer is formed in a thickness of 20 nm as shown in FIG. 7A, and a W layer 156 is uniformly formed in a thickness of 50 to 70 nm by CVD method, so that tungsten is buried in the cell contact hole. At this stage, an upper face of the W layer 156 becomes recessed, as a result of performing the CVD method to form the W layer 156.

Figure 7B:
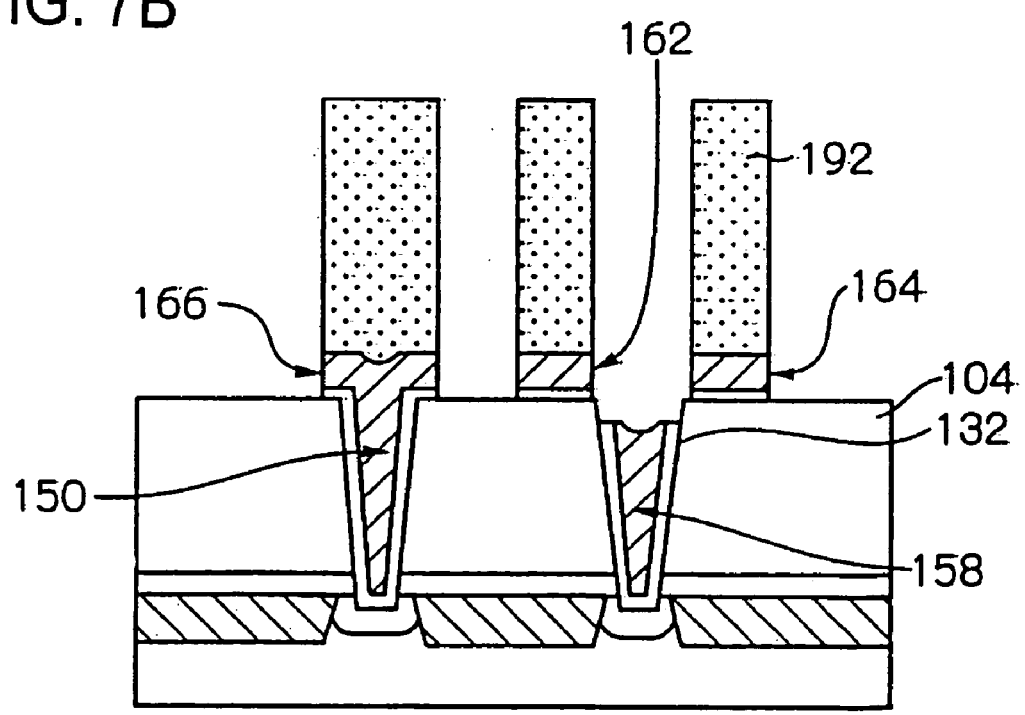
Figure 8:
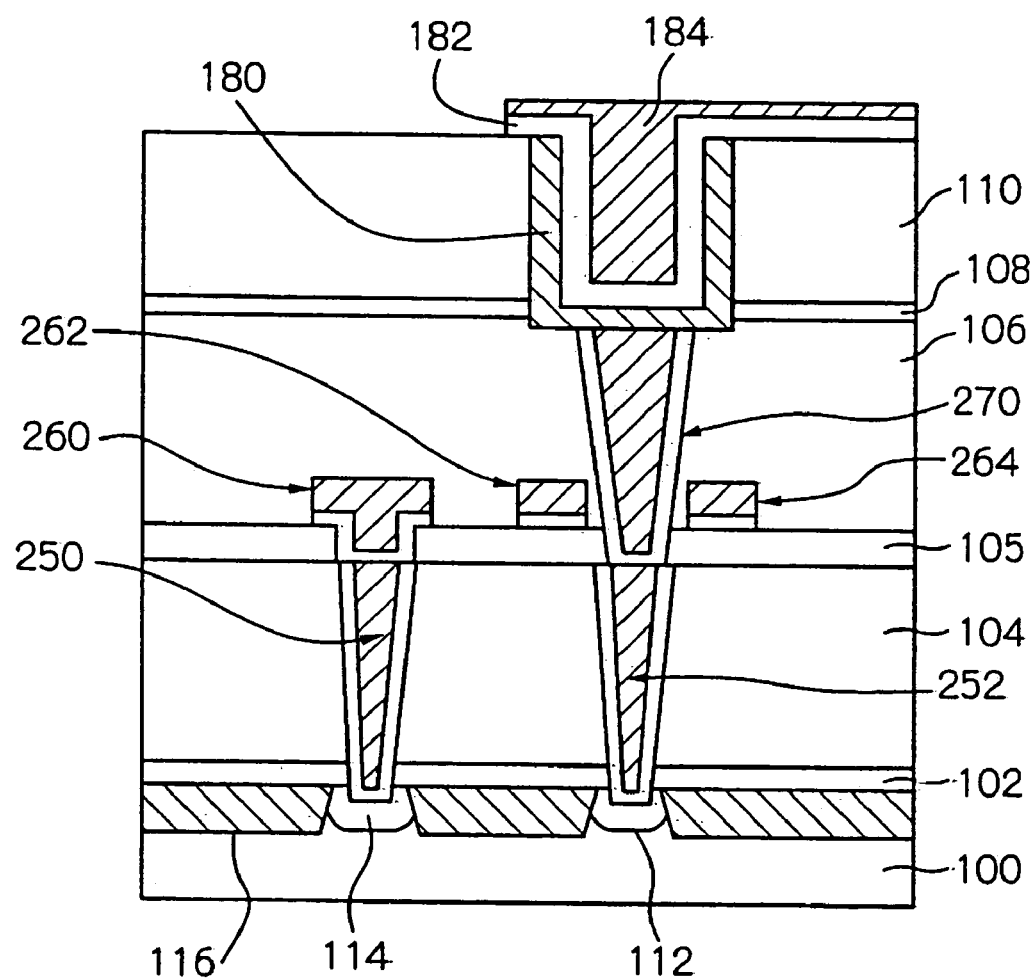
FIG. 8 is a schematic cross-sectional view showing a constitution of a conventional semiconductor device.
Figure 9A:
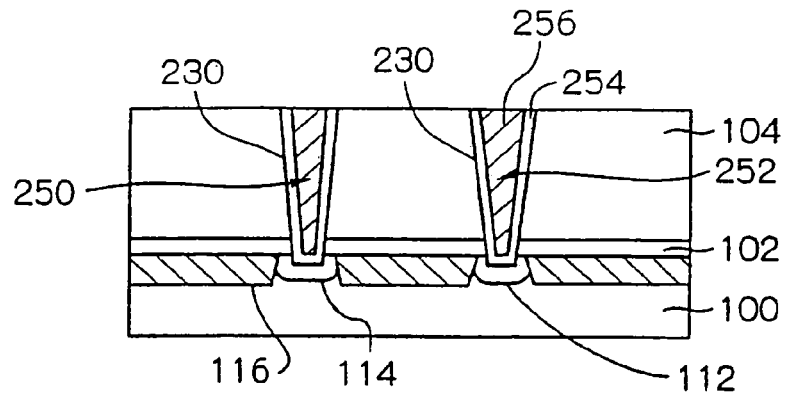
FIGS. 9A to 9C are are schematic cross-sectional views showing a method of manufacturing the semiconductor device of FIG. 8.
Figure 9B:
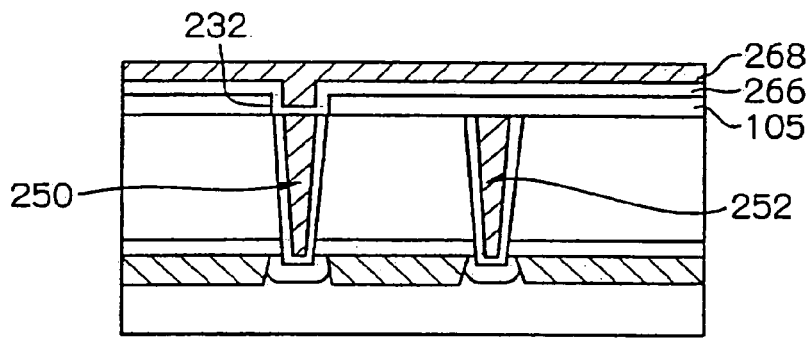
Figure 9C:
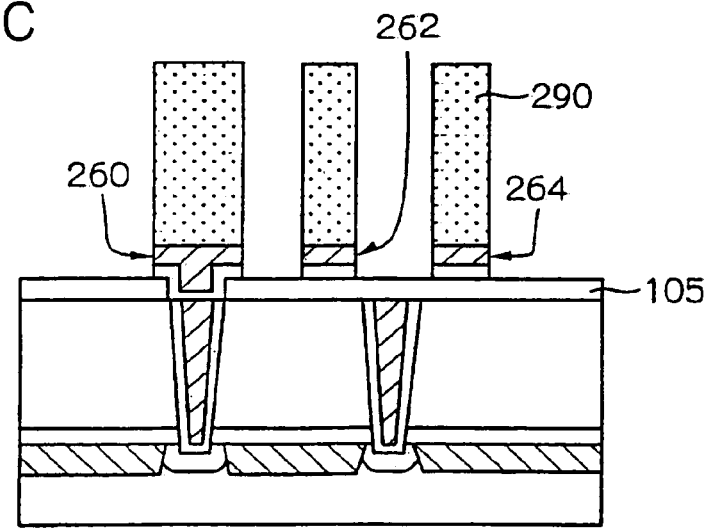

Thereafter, the lithography and etching process shown in FIGS. 3D through 4F is carried out, to form the first bit line 166 and the first cell contact plug 150 into a unified constituent, and the second bit line 162, the third bit line 164 and the second cell contact plug 158 as shown in FIG. 7B.

As shown in FIG. 7B, a central region of an upper face of the W layer 156 in the second cell contact hole 132 is formed in a recessed shape. This is because, since the anisotropic etching for forming the bit line is uniformly performed on the W layer 156, the recessed surface shape formed through the process of FIG. 7A reappears on an upper face of the W layer 156 after the etching process.

Finally, by carrying out the subsequent processes from FIG. 4G in the same way as the first working example, the semiconductor device shown in FIG. 6 is completed.

According to this working example, a thickness of the conductive layer is made to be 70 to 90 nm, which is a total of a thickness of the barrier metal layer and the W layer, against a diameter of 0.12 to 0.14 µm of the cell contact hole, in order to fully bury the conductive layer therein. In view of this it is understood that a maximum diameter of the cell contact hole may preferably be 1.3(=0.12/0.09) to 2(=0.14/0.07) times as large as a thickness of the conductive layer. Fully burying the conductive layer in the cell contact hole in this way can prevent the conductive layer from being etched as deeply as exposing source electrode 112 at a bottom portion of the cell contact plug, when performing the etching process to form the bit lines.

If a thickness of the conductive layer of the bit line is too thin, sufficient conductivity may not be secured. However, the above specified thickness of the conductive layer is not only ensures full intrusion into the cell contact hole of 0.12 to 0.14 µm in diameter, but also is sufficient for securing conductivity.

Also, since an upper face of the second cell contact plug 158 is recessed, a contact area thereof with the capacitance contact plug 170 becomes larger, and resultantly contact resistance is reduced.

Also, while the capacitance contact plug 170 was formed on the second cell contact plugs 152, 158 according to the first and the second working examples, an interconnect may also be formed, without limitation to a plug.

Further, while the W layer is adopted as a conductive layer to be formed by CVD method, a tungsten nitride layer may also be employed.

Further, while the SiON layer and the silicon nitride layer are employed from the viewpoint of a sufficient etching selectivity with respect to the silicon oxide layer, a different dielectric layer may be employed.

Furthermore, while the TiN layer is employed as the barrier metal layer, a titanium layer, or a lamination including a TiN layer and a titanium layer may also be employed.

Furthermore, an upper face and a lateral face of the bit line may be covered with a silicon nitride layer in a similar way to the method of manufacturing according to the above cited document. In this case, larger room can be secured for absorbing a positioning error of the bit line with respect to the capacitance contact hole.

The present invention has been described in details based on the working examples. It is to be understood that these working examples are only exemplary, and that it is apparent to those skilled in the art that various modifications may be made without departing the spirit and the scope of the present invention.

What is claimed is:

1. A method of manufacturing a semiconductor device including a transistor formed on a semiconductor substrate and a capacitance element formed on said transistor and connected thereto, comprising:

forming a transistor on a semiconductor substrate;

forming a first interlayer dielectric film that covers said transistor;

forming a first connection hole and a second connection hole in said first interlayer dielectric film so as to reach an upper face of said transistor;

forming a continuous conductive layer in said first connection hole, in said second connection hole and on said first interlayer dielectric film, to thereby form a first conductive plug in said first connection hole, a second conductive plug in said second connection hole, and a surface conductive layer on said first interlayer dielectric film;

forming a resist layer in a region on said surface conductive layer including right above said first conductive plug but excluding right above said second conductive plug;

performing anisotropic etching on said surface conductive layer utilizing said resist layer as a mask to form a bit line connected to said first conductive plug and to expose an upper face of said second conductive plug;

forming a second interlayer dielectric film on said first interlayer dielectric film;

forming a third conductive plug connected to said second conductive plug in said second interlayer dielectric film; and forming a capacitance element connected to said third conductive plug on said second interlayer dielectric film.

2. The method in accordance with claim 1, wherein the step of forming said bit line and exposing an upper face of said second conductive plug includes forming a recess on an upper face of said second conductive plug.

3. The method in accordance with claim 1, wherein the step of forming said first conductive plug, said second conductive plug and said surface conductive layer includes forming said continuous conductive layer having a thickness not less than ½ but not greater than $1/1.3$ of a maximum diameter of said second connection hole.

4. The method in accordance with claim 1, further comprising:

performing anisotropic etching on an upper face of said second conductive plug so as to locate said upper face of said second conductive plug lower than an upper face of said first interlayer dielectric film.

5. The method in accordance with claim 1, wherein the step of forming said first conductive plug, said second conductive plug and said surface conductive layer includes forming said continuous conductive layer by CVD method.

6. The method in accordance with claim 1, wherein the step of forming said first conductive plug, said second conductive plug and said surface conductive layer includes forming said continuous conductive layer containing a tungsten.

7. The method in accordance with claim 1, further comprising forming a third interlayer dielectric film on said second interlayer dielectric film;

wherein the step of forming said capacitance element includes forming said capacitance element in said third interlayer dielectric film.

8. A method of manufacturing a semiconductor including a contact plug and an interconnect electrically insulated from said contact plug, comprising:

forming a first interlayer dielectric film having a first opening where a contact plug is to be formed;

uniformly forming a first conductive layer on said first interlayer dielectric film and in said first opening;

forming a resist defining an interconnect pattern by a lithography process on a region excluding said first opening;

performing first anisotropic etching to remove a region of said first conductive layer not covered with said resist until an upper face of said first interlayer dielectric film is exposed, thus to form an interconnect and said contact plug.

9. The method in accordance with claim 8, wherein the step of forming said first conductive layer further comprising forming a recess on an upper face of said first conductive layer at a position corresponding to said first opening;

performing a first anisotropic etching to form a recess on an upper face of said contact plug;

forming said interconnect and said contact plug and then removing said resist;

forming a second interlayer dielectric film having a second opening through which to expose a part of said recess of said contact plug; and forming a second conductive layer in said second opening.

10. The method in accordance with claim 8, wherein a maximum diameter of said first opening is 1.3 to 2 times as large as a film thickness of said first conductive layer.

11. The method in accordance with claim 8, wherein the step of performing said first anisotropic etching further comprises performing a second anisotropic etching for scraping said first conductive layer of said contact plug, for extending a minimum distance between said contact plug and said interconnect.

12. The method in accordance with claim 8, wherein the step of forming said first conductive layer is performed by CVD method.

13. The method in accordance with claim 8, wherein the first conductive layer contains tungsten.

14. A method of manufacturing a semiconductor device comprising:

forming a first interlayer film on a semiconductor substrate;

forming a first hole and second hole in said first interlayer film to expose a surface of said semiconductor substrate in said first hole and said second hole;

forming a first conductive film to fill said first hole and said second hole, said first conductive film extending on an upper surface of said first interlayer film; and removing a part of said first conductive film to leave said first conductive film on said upper surface of said first interlayer film as bit lines, and to leave said first conductive film in said first hole and said second hole, said bit lines being apart from said first conductive film left in said second hole.

15. The method according to claim 14, wherein one of said bit lines is connected to said first conductive film left in said first hole.

16. The method according to claim 15, further comprising:

forming a second interlayer film on said first interlayer film to cover said bit lines;

forming a third hole in said second interlayer film to expose said first conductive film left in said second hole;

forming a second conductive film in said third hole to be connected to said first conductive film left in said second hole; and forming a capacitor on said second interlayer film to be connected to said second conductive film.

17. The method according to claim 14, wherein in said removing step, a recess in said first conductive film is formed in said second hole.

* * * * *